(12) United States Patent
Lin et al.

(10) Patent No.: US 6,197,672 B1
(45) Date of Patent: Mar. 6, 2001

(54) METHOD FOR FORMING POLYCIDE DUAL GATE

(75) Inventors: Yung-Chang Lin, Feng-Yuan; Tung-Po Chen, Taichung; Jacob Chen, Hsinchu, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/208,271

(22) Filed: Dec. 8, 1998

(51) Int. Cl.$^7$ ................................................ H01L 21/3205
(52) U.S. Cl. ............................................. 438/592; 438/305
(58) Field of Search .................................. 438/283, 491, 438/514, 516, 519, 527, 532, 592

(56) References Cited

U.S. PATENT DOCUMENTS

| | | |
|---|---|---|
| 5,652,183 * | 7/1997 | Fujii . |
| 5,712,196 * | 1/1998 | Ibok . |
| 5,744,845 * | 4/1998 | Sayama et al. . |
| 5,780,330 * | 7/1998 | Choi . |
| 5,877,535 * | 3/1999 | Matsumoto . |
| 5,943,592 * | 8/1999 | Tsukamoto et al. . |
| 6,060,361 * | 5/2000 | Lee . |

OTHER PUBLICATIONS

Sayama et al, "Low voltage opeation of sub–quarter micron W–Polycide dual gate CMOS with non–uniformity doped channel," IEEE IEDM pp. 583–586 (1996).*

Wolf, "Silicon Processing for the VLSI Era," vol. 1, pp. 384–386 (1986).*

* cited by examiner

*Primary Examiner*—Richard Booth
(74) *Attorney, Agent, or Firm*—Thomas, Kayden, Horstemeyer & Risley

(57) ABSTRACT

A method for forming a dual polycide gate. A substrate that has an isolation structure is provided, a polysilicon layer (or an α-Si layer) is deposited over the substrate, N-type and P-type dopants are implanted into the polysilicon layer to form a dual gate having an N-type gate and a P-type gate. An annealing step is performed to restore the surface crystal structure of the polysilicon layer, an oxide layer is deposited on the doped polysilicon layer, and a silicide layer is formed over the oxide layer. The silicide layer, the oxide layer and the polysilicon layer are defined to form a polycide gate, a lightly doped source/drain region is formed beside the gate in the substrate. A spacer is formed on the sidewall of the gate, and a heavily doped source/drain region is formed beside the spacer in the substrate.

17 Claims, 4 Drawing Sheets

METHOD FOR FORMING POLYCIDE DUAL GATE

BACKGROUND OF THE INVENTION

1. Field of the Invention

The present invention relates to a method for forming a semiconductor device. More particularly, the present invention relates to a method for forming a polycide dual gate.

2. Description of the Related Art

When integration of elements in integrated circuit (IC) increases to achieve deep sub-micron processes, a dual gate having N-type gate and P-type gate is necessary. A tungsten silicide layer having low resistance is formed on a doped polysilicon layer, and then the tungsten silicide layer and the doped polysilicon layer are defined to form a polycide gate.

FIG. 1 is schematic three-dimensional view showing a conventional polycide dual gate. Referring to FIG. 1, a substrate 40 is provided, a gate oxide layer 42 is deposited on the surface of the substrate 40, and a polysilicon layer 44 is formed on the gate oxide layer 42. An N-type and P-type ion implantation step is performed on the polysilicon layer 44 to form a dual gate 48; the dual gate 48 comprises an N-type (or P-type) gate 44' and P-type (or N-type) gate 44". The tungsten silicide layer 46 is directly formed on the polysilicon layer 44 to increase conductivity of the dual late 48. The method causes the interdiffusion 50 of N-type and P-type ions in the dual gate 48 through the tungsten silicide layer 46 while a thermal process is performed, and the interdiffusion 50 phenomenon will induce devices failure.

FIGS. 2A through 2C are schematic. cross-sectional views showing the progression of another conventional manufacturing steps for a polycide dual gate. Referring to FIG. 2A, a substrate 10 that has an isolation structure 11 is provided; the isolation structure 11 is filled with insulation material. A gate oxide layer 12 is deposited on the surface of the substrate 10, a polysilicon layer 14 is deposited on the gate oxide layer 12, and an oxide layer 16 is formed on the polysilicon layer 14 by chemical oxidation (or chemical vapor deposition or thermal oxidation). A amorphous silicon layer 18 (α-Si layer) is formed on the surface of the oxide layer 16, and an N-type and P-type ions implantation step is performed. An annealing step is performed to restore the surface crystal structure of the α-Si layer 18, and then a tungsten silicide layer 20 is formed over the α-Si layer 18. Since the N-type and the P-type ions in the dual gate diffuse through the tungsten silicide layer 20 while a thermal process is performed, in this invention, the oxide layer 16 is provided as a impurity diffusion barrier layer in order to prevent the interdiffusion. Because the tungsten silicide layer 20 does not have good adhesion with the oxide layer 16, hence the α-Si layer 18 having low resistance is formed between the tungsten silicide layer 20 and the oxide layer 16 to improve the adhesion and the conductivity, then a stack structure comprising the tungsten silicide layer/α-Si layer/oxide layer/polysilicon layer/gate oxide layer is made. However, the stack structure results in increased RC time delay of the polysilicon layer 14 and easily changes the original MOS structure into an E²PROM structure. This change will affect device performance.

Referring to FIG. 2B, the tungsten silicide layer 20, the α-Si layer 18, the oxide layer 16, the polysilicon layer 14 and the gate oxide layer 12 are defined to become a tungsten silicide layer 20a, an α-Si layer 18a, an oxide layer 16a, a polysilicon layer 14a and a gate oxide layer 12a by dry etching to form a gate region. The gate region is used as a mask, and a lightly doped source/drain region 22 is formed beside the gate in the substrate 10 by an ion implantation step. A silicon dioxide layer 24 is formed conformal to the substrate 10.

As shown in FIG. 2C, a spacer 24a is formed on the sidewall of the gate when the silicon dioxide layer 24 is etched back by dry etching. The spacer 24a and the gate are used as a mask, and a heavily doped source/drain region 26 is formed beside the spacer 24a in the substrate 10 by an ion implantation step. An annealing step is performed to restore the surface crystal structure of the heavily doped source/drain region 26 by rapid thermal processing (RTP).

Semiconductor miniaturization results in increasing the contact resistance of the interface between different layers. Therefore the dopant concentration of contact surface must be sufficient high to attain sufficient low contact resistance. In the conventional method for forming a polycide dual gate, the α-Si layer has a low dopant concentration, hence the RC time delay of polysilicon gate is still high. The oxide layer prevents interdiffusion of dopants but results in changing the original MOS structure into an E²PROM or EPROM structure, which change will affect device performance. The α-Si layer is formed between the tungsten suicide and the oxide layer to enhance adhesion between both of them, but the structure becomes complicated.

SUMMARY OF THE INVENTION

Accordingly, the present invention provides a method for forming a polycide dual gate. This method can reduce RC time delay and simplify the structure of devices to favor the electrical performance of devices and decrease the capital expenditure.

To achieve these and other advantages and in accordance with the purpose of the invention, as embodied and broadly described herein, the invention provides a method for forming a polycide dual gate. A substrate that has an isolation structure is provided, a polysilicon layer (or a α-Si layer) is deposited over the substrate, N-type and P-type dopants are implanted into the polysilicon layer to form a doped polysilicon layer that has both N-type and P-type. An annealing step is performed to restore the surface crystal structure of the polysilicon layer, an oxide layer is deposited on the doped polysilicon layer, and a silicide layer is formed over the oxide layer. The silicide layer, the oxide layer and the polysilicon layer are defined to form a gate, and a lightly doped source/drain region is formed beside the gate in the substrate. A spacer is formed on the sidewall of the gate, and a heavily doped source/drain region is formed beside the spacer in the substrate.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
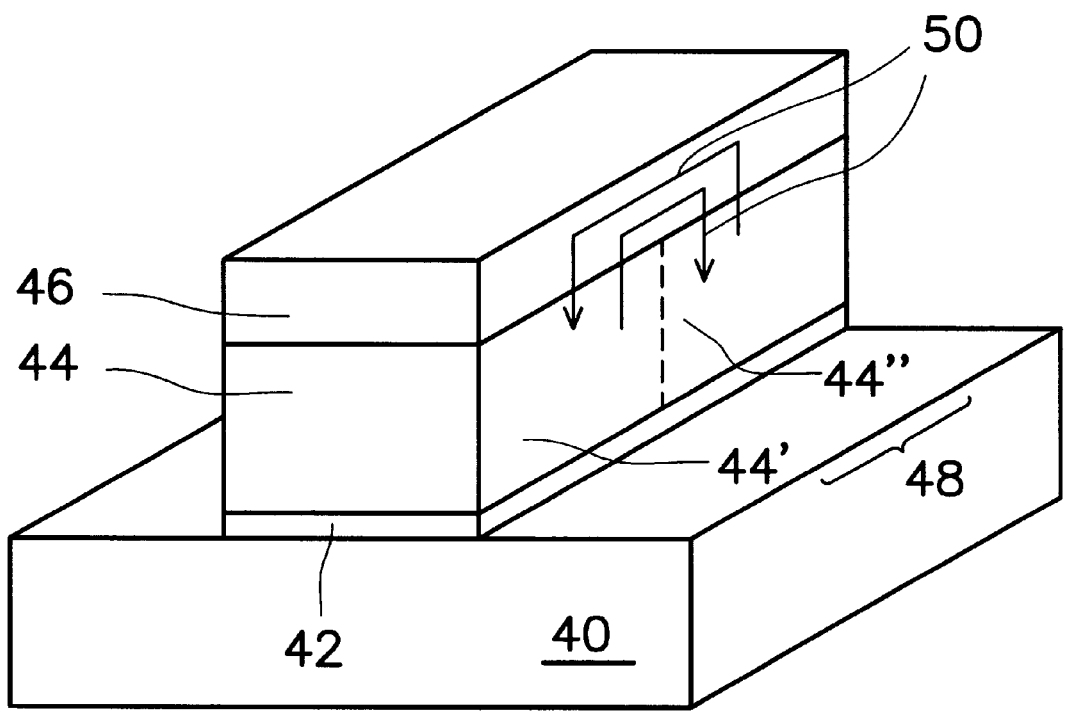
FIG. 1 is schematic, three-dimensional view showing a conventional polycide dual gate.
Figure 2A:
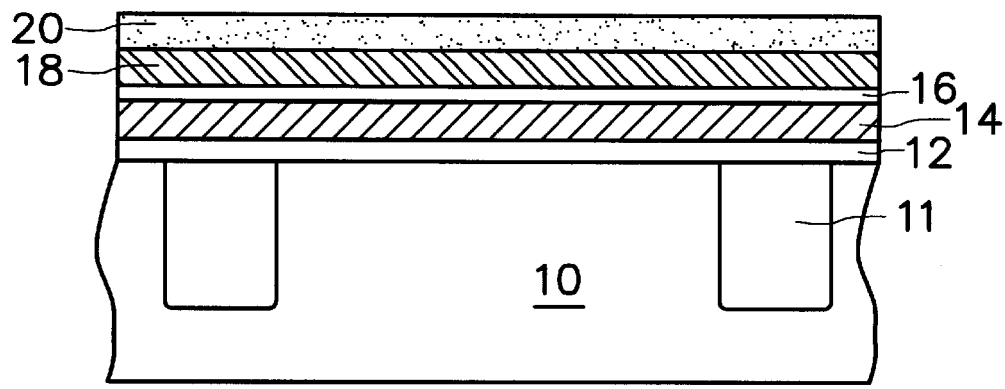
FIGS. 2A through 2C are schematic, cross-sectional views showing the progression of another conventional manufacturing steps for a polycide dual gate.
Figure 2B:
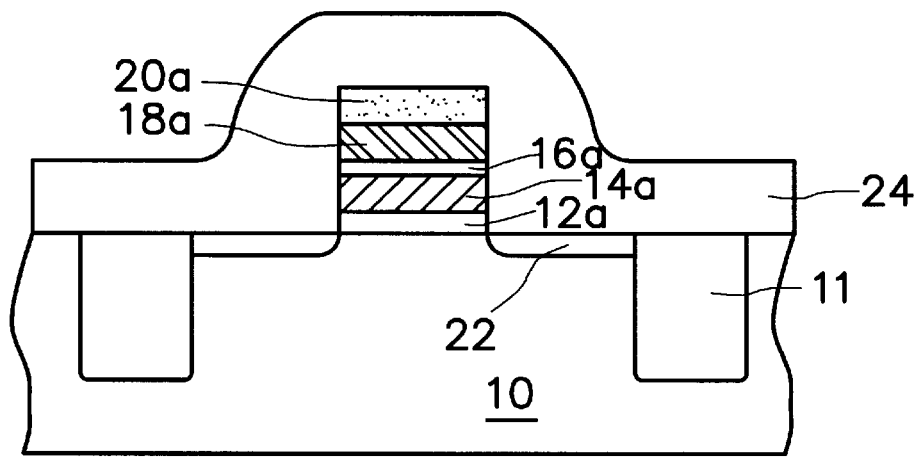
Figure 2C:
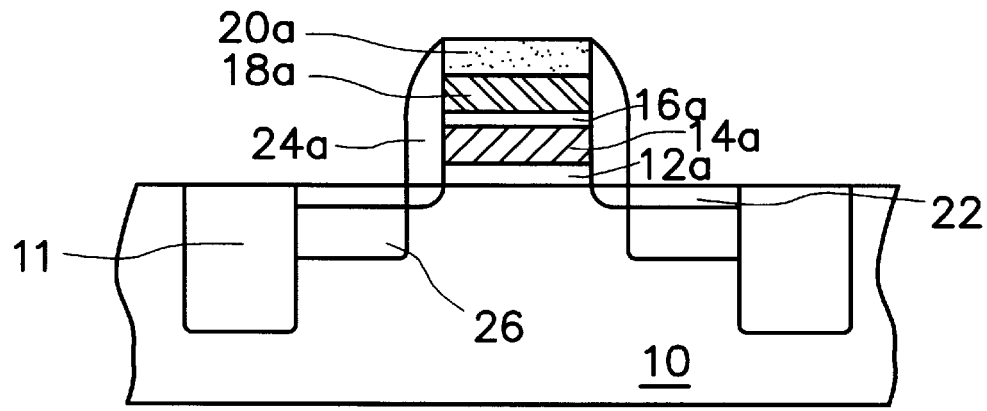

Reference will now be made in detail to the present preferred embodiments of the invention, examples of which are illustrated in the accompanying drawings. Wherever possible, the same reference numbers are used in the drawings and the description to refer to the same or like parts.

Figure 3:
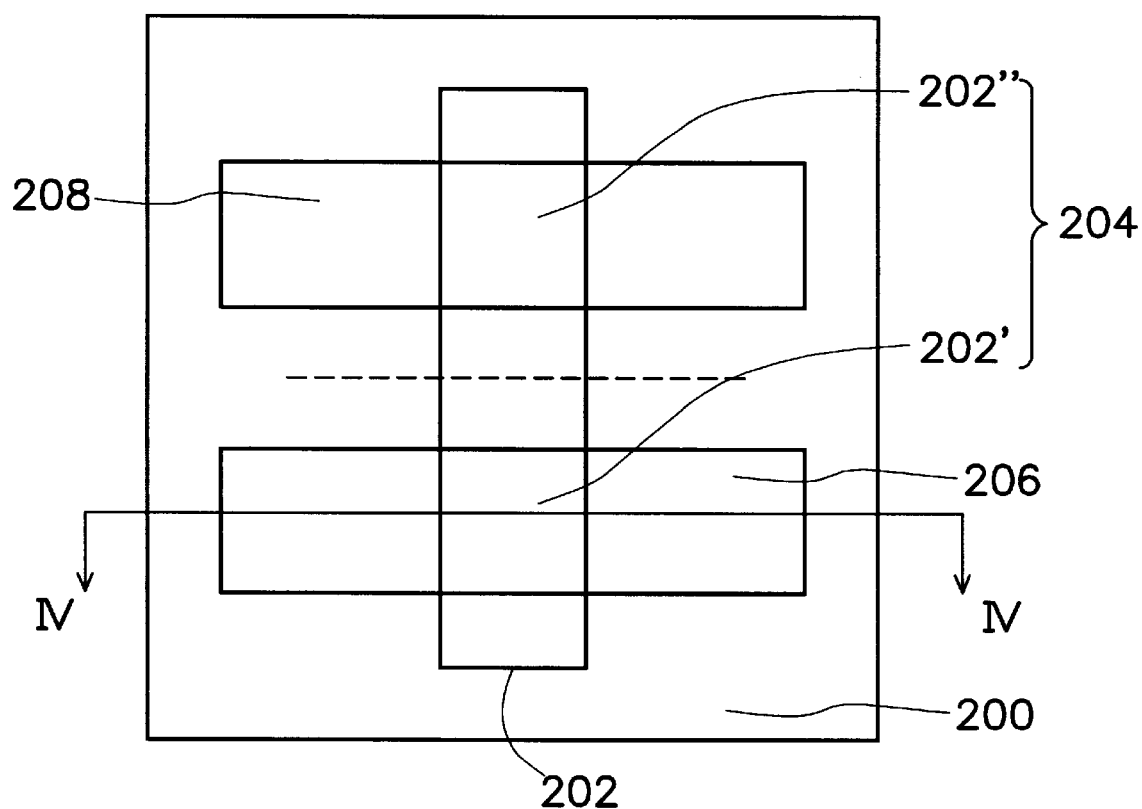
FIG. 3 is schematic, top view showing a polycide dual gate according to the preferred embodiment of this invention.

FIG. 3 is schematic, top view showing a polycide dual gate according to the preferred embodiment of this invention. Referring to FIG. 3, a substrate 200 having a gate 202 is provided, N-type and P-type ions are implanted into the gate 202 to form a dual gate 204 having a first type gate 202' such as an NMOS gate and a second type gate 202" such as a PMOS gate. A first type source/drain region 206 and a second type source/drain region 208 are formed in the substrate 200.

Figure 4A:
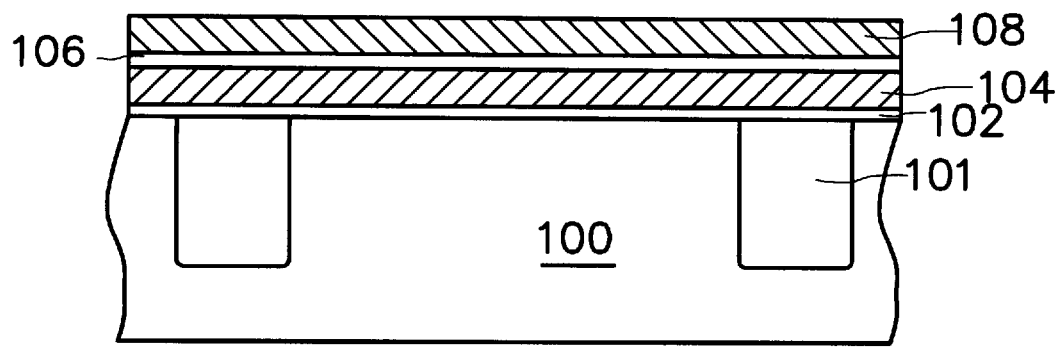
FIGS. 4A through 4C are schematic, cross-sectional views showing the progression of manufacturing steps for a polycide dual gate according to FIG. 3 of cross-sectional line 4—4 in the preferred embodiment of this invention.
Figure 4B:
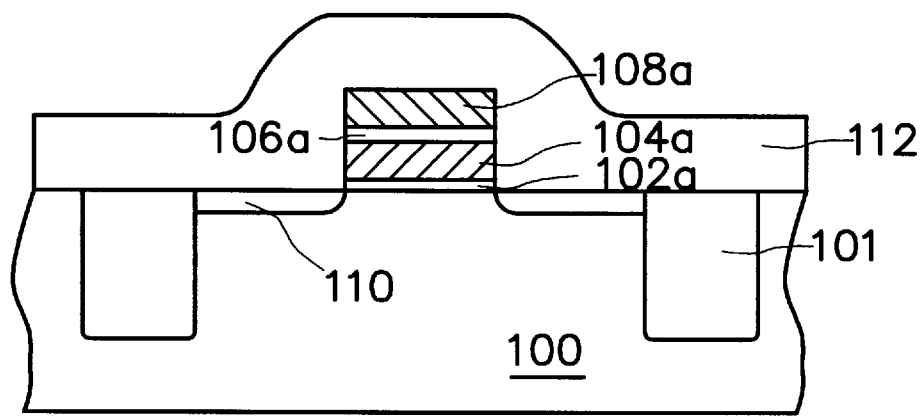
Figure 4C:
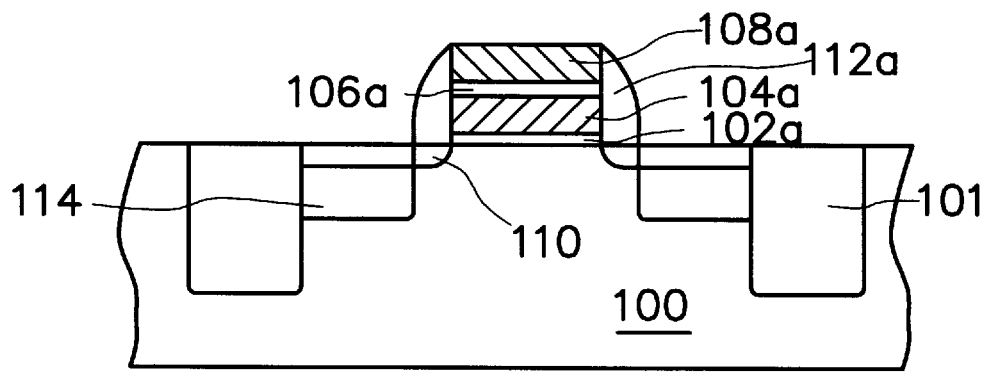

FIGS. 4A through 4C are schematic. cross-sectional views showing the progression of manufacturing steps for a polycide dual gate according to FIG. 3 of cross-sectional line 4—4 in the preferred embodiment of this invention. Referring to FIG. 4A, a substrate 100 that has an isolation structure 101 is provided. The isolation structure 101 is filled with insulation material. A gate oxide layer 102 is deposited on the surface of the substrate 100, a polysilicon layer 104 (or an α-Si layer) is deposited on the gate oxide layer 102, for example, by chemical vapor deposition (CVD) or physical vapor deposition (PVD).

N-type dopants such as arsenic or phosphorus and P-type dopants such as boron ions are implanted into the polysilicon layer 104 of a dual gate to form a doped polysilicon layer having N-type and P-type dopants. An annealing step is performed to restore the surface crystal structure of the polysilicon layer 104, an oxide layer 106 is formed on the polysilicon layer 104, for example, by chemical oxidation (or CVD or thermal oxidation), and a suicide layer 108 such as a titanium silicide ($TiSi_x$) or a cobalt silicide ($CoSi_x$) layer is formed over the oxide layer 106. In the conventional method for forming a polycide dual gate, the doped polysilicon layer and the tungsten silicide ($WSi_x$) constitute the polycide because the conductivity of the tungsten silicide is better than the conductivity of the doped polysilicon layer. However, the resistance of the tungsten silicide is still high, and the resistance of the titanium silicide is lower than the tungsten silicide by about 3–5 times, therefore the RC time delay of polysilicon layer 104 and the conductivity are better than before when a complex stack gate is made.

When integration of elements in integrated circuit (IC) increases to achieve deep sub-micron processes, the interdiffusion of dopants through the tungsten silicide layer is more serious. Therefore, the present invention relates to a method for forming a polycide dual gate using a titanium silicide or a cobalt silicide instead of the tungsten silicide used in the conventional method. In addition to the silicide layer 108 such as a titanium silicide and the oxide layer 106 preventing interdiffusion of N-type and P-type dopants implanted into polysilicon layer in the dual gate during thermal processes, the titanium silicide 108 and the oxide layer 106 also have good adhesion, so the process of forming an α-Si layer is not necessary. This invention can eliminate interdiffusion and simplify the structure to maintain device performance and reduce capital expenditure. Also, the titanium silicide 108 reacts with the oxide layer 106 to produce spiking and penetrate through the oxide layer 106 (the thickness of the oxide layer cannot be thick). The method does not allow the original MOS structure to change into an $E^2PROM$ or EPROM structure by the spiking.

Referring to FIG. 4B, the silicide layer 108, the oxide layer 106, the polysilicon layer 104 and the gate oxide layer 102 are defined to become a silicide layer 108a, an oxide layer 106a, a polysilicon layer 104a and a gate oxide layer 102a to form a gate region. The gate region is used as a mask, and a lightly doped source/drain region 110 is formed beside the gate in the substrate 100, for example, by an ion implantation step. An oxide layer 112 such as silicon dioxide is formed conformal to the substrate 100.

As shown in FIG. 4C, a spacer 112a is formed on the sidewall of gate when the oxide layer 112 is etched back, for example, by dry etching. The spacer 112a and the gate are used as a mask; a heavily doped source/drain region 114 is formed beside the spacer 112a in the substrate 100, for example, by an ion implantation step. An annealing step is performed to restore the surface crystal structure of the heavily doped source/drain region 114, for example, by rapid thermal processing (RTP).

(1) The invention for manufacturing a polycide dual gate provides a titanium silicide instead of tungsten silicide, in order to reduce the RC time delay when the complex stack gate is made.

(2) The invention for manufacturing a polycide dual gate provides a titanium silicide or a cobalt silicide and an oxide layer to prevent interdiffusion of N-type and P-type dopants implanted into polycide layer in the dual gate during thermal processes, therefore the invention can maintain device performance.

(3) The invention for manufacturing a polycide dual gate provides a titanium silicide layer, because the titanium suicide layer has a good adhesion with the oxide layer, the processes of forming a α-Si layer is not necessary, this invention can simplify the structure and reduce capital expenditure.

(4) The invention for manufacturing a polycide dual gate provides a titanium silicide layer; the titanium silicide reacts with the oxide layer to result in spiking and penetrates through the oxide layer. The method can prevent the original MOS structure from changing into an $E^2PROM$ or EPROM structure by the spiking so that device performance is maintained.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A manufacturing method for a polycide dual gate, wherein a substrate having a gate oxide layer and a polysilicon layer is provided, comprising the steps of:
    implanting first conductive type ions and second conductive type ions into the polysilicon layer to form a first conductive region of the polysilicon layer and a second conductive region of the polysilicon layer;
    forming an oxide layer on the polysilicon layer;
    forming a silicide layer on the oxide layer, wherein the silicide layer is a titanium silicide layer; and defining the titanium silicide layer, the oxide layer and the first conductive region of the polysilicon layer and the second conductive region of the polysilicon layer, so as to form a first gate and a second gate.

2. The method of claim 1 wherein the first conductive type ions include N-type ions.

3. The method of claim 1, wherein the second conductive type ions include P-type ions.

4. The method of claim 2, wherein the N-type ions include arsenic and phosphorus ions.

5. The method of claim 3, wherein the P-type ions include boron ions.

6. The method of claim 2, wherein the first conductive type ions include P-type ions.

7. The method of claim 3, wherein the second conductive type ions include N-type ions.

8. The method of claim 1, wherein the step of forming the oxide layer includes using a chemical oxidation process.

9. The method of claim 1, wherein the silicide layer further includes a cobalt silicide layer.

10. A manufacturing method for polycide dual gate, comprising the steps of:

providing a substrate;

forming a gate oxide layer on the substrate;

forming a polysilicon layer on the gate oxide layer;

performing a first ion implantation step for implanting a first conductive type ions and a second conductive type ions into the polysilicon layer, so as to form a first conductive region of the polysilicon layer and a second conductive region of the polysilicon layer;

forming an oxide layer by using a chemical oxidation process on the polysilicon layer;

forming a silicide layer on the oxide layer, wherein the silicide layer is a titanium silicide layer;

defining the titanium silicide layer, the oxide layer and the first conductive region of the polysilicon layer and the second conductive region of the polysilicon layer, so as to form a first gate and a second gate;

performing a second ion implantation step with the gates serving as masks, so as to form a lightly doped source/drain region beside the gate in the substrate;

forming a spacer on the sidewall of the gate; and performing a third ion implantation step with the spacer and the gates serving as masks, so as to form a heavily doped source/drain region beside the gate in the substrate.

11. The method of claim 10, wherein the silicide layer further includes a cobalt silicide layer.

12. The method of claim 10, wherein the step of forming the lightly doped source/drain region includes using ion implantation.

13. The method of claim 10 wherein the step of forming the heavily doped source/drain region includes using ion implantation.

14. The method of claim 8, wherein the chemical oxidation process includes chemical vapor deposition (CVD).

15. The method of claim 8, wherein the chemical oxidation process includes thermal oxidation.

16. The method of claim 10, wherein the chemical oxidation process includes CVD.

17. The method of claim 10, wherein the chemical oxidation process includes thermal oxidation.

* * * * *